United States Patent
Iwamuro (10) Patent No.: US 8,198,676 B2
(45) Date of Patent: Jun. 12, 2012

(54) P-CHANNEL SILICON CARBIDE MOSFET

(75) Inventor: Noriyuki Iwamuro, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 230 days.

(21) Appl. No.: 12/717,670

(22) Filed: Mar. 4, 2010

(65) Prior Publication Data
US 2010/0224886 A1 Sep. 9, 2010

(30) Foreign Application Priority Data
Mar. 4, 2009 (JP) .................... 2009-050912

(51) Int. Cl.
*H01L 27/108* (2006.01)
*H01L 29/76* (2006.01)

(52) U.S. Cl. ......... 257/330; 257/331; 257/341; 438/270

(58) Field of Classification Search .......... 257/330–331, 257/341, E21.064, E21.065, E29.104, E29.271; 438/270
See application file for complete search history.

(56) References Cited

U.S. PATENT DOCUMENTS

| | | | |
|---|---|---|---|
| 5,614,749 A | 3/1997 | Ueno | |
| 5,693,569 A | 12/1997 | Ueno | |
| 6,084,264 A * | 7/2000 | Darwish | 257/329 |
| 6,351,018 B1 * | 2/2002 | Sapp | 257/499 |
| 7,075,147 B2 | 7/2006 | Cao | |
| 2002/0043684 A1 | 4/2002 | Kubo | |
| 2005/0006700 A1 | 1/2005 | Cao | |
| 2009/0072304 A1 | 3/2009 | Adan | |

FOREIGN PATENT DOCUMENTS

| | | |
|---|---|---|
| JP | 63-253720 A | 10/1988 |
| JP | 08-204179 A | 8/1996 |
| JP | 2001-085612 A | 3/2001 |
| JP | 2002-050760 A | 2/2002 |
| JP | 3329707 B2 | 9/2002 |
| JP | 2007-042892 A | 2/2007 |

OTHER PUBLICATIONS

Hatakeyama, T. et al. "Impact Ionization Coefficients of 4H-SiC", Materials Science Forum, vols. 457-460 (2004) pp. 673-676, Trans Tech Publications, Switzerland.
Shenai, Krishna et al. "Optimum Semiconductors for High-Power Electronics", IEEE Transaction on Electron Devices vol. 36, No. 9, Sep. 1989, pp. 1811-1823.
Iwamuro, Noriyuki et al. "Numerical Analysis of Short-Circuit Safe Operating Area for p-Channel and n-Channel IGBT's", IEEE Transactions on Electron Devices, vol. 38, No. 2 ,Feb. 1991, pp. 303-309.

* cited by examiner

*Primary Examiner* — Theresa T Doan
(74) *Attorney, Agent, or Firm* — Rossi, Kimms & McDowell LLP (57) ABSTRACT

A second trench in each source electrode portion (Schottky diode portion) is formed to have a depth equal to or larger than the depth of a first trench in each gate electrode portion. The distance between the first and second trenches is set to be not longer than 10 μm. A source electrode is formed in the second trench and a Schottky junction is formed in the bottom portion of the second trench. In this manner, it is possible to provide a wide band gap semiconductor device which is small-sized, which has low on-resistance and low loss characteristic, in which electric field concentration into a gate insulating film is relaxed to suppress reduction of a withstand voltage, and which has high avalanche breakdown tolerance at turn-off time.

2 Claims, 8 Drawing Sheets

- 3  n⁻-SiC Layer
- 21 p⁻-SiC Layer
- 2  p⁺-Type SiC Layer
- 1  n⁻-SiC Layer

FIG. 4

- 4
- 3  n⁻-SiC Layer
- 21 p⁻-SiC Layer
- 2
- 1  n⁻-SiC Layer Substrate

P-CHANNEL SILICON CARBIDE MOSFET

BACKGROUND

The present invention relates to a high withstand voltage p-channel MOSFET using, as a semiconductor crystal, silicon carbide which is a kind of wide band gap (hereinafter abbreviated to as WBG) crystalline material.

Figure 1:
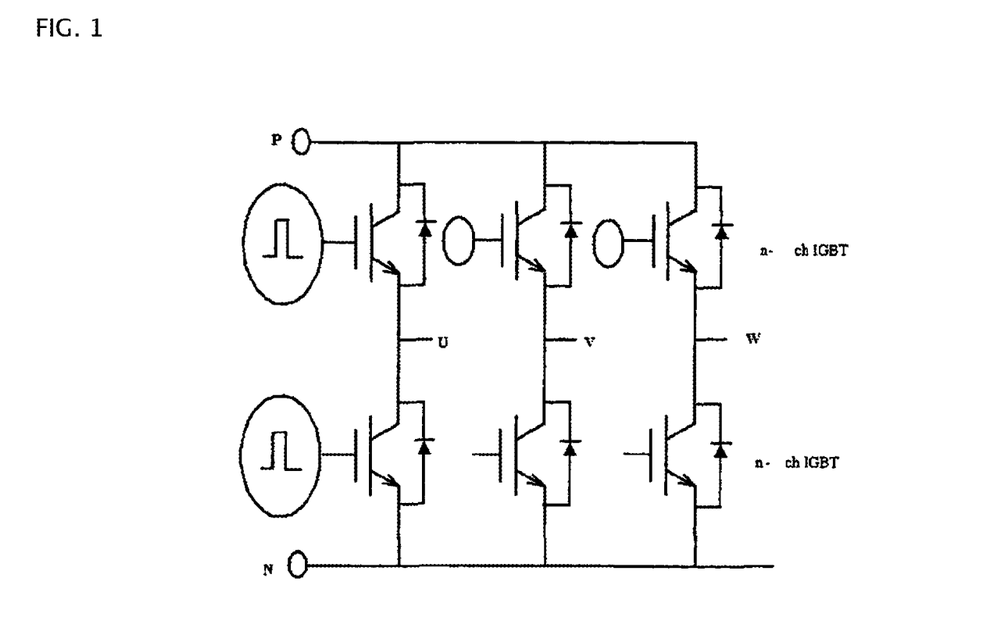
FIG. 1 is a diagram showing an example of an inverter circuit composed of n-channel IGBT's and FWD's.

FIG. 1 shows a circuit of a three-phase inverter IGBT module which is a representative power semiconductor module. In this inverter circuit, three arms each composed of series-connected two units are provided in parallel with one another on the assumption that a circuit in which a cathode and an anode of a free wheeling diode (hereinafter abbreviated to as FWD) are back-to-back connected between a collector and an emitter of an IGBT is regarded as one unit. The three arms are connected to terminals P and N which are common to the three arms and between which a main current flows. Junctions between the units in the three arms are provided as output terminals U, V and W respectively. To drive the IGBT module forming such an inverter circuit, a lower arm element gate driving circuit for driving the lower IGBT's of the arms is connected to three upper arm element gate driving circuits for driving the upper IGBT's of the arms respectively. These driving circuits are further connected to a control circuit while electrically insulated by photo couplers not shown, respectively. The gate driving circuits require forward bias and backward bias power sources not shown.

When the IGBT module shown in FIG. 1 is driven, one lower arm power source and three upper arm power sources, that is, four power sources in total are required as the power sources. As a result, the configuration of the gate driving circuits is complicated causing an increase in device size and a resulting increase in cost. As described above, increase in size of the gate driving circuits is caused by use of all homopolarity n-channel IGBT's as IGBT's mounted in the IGBT module. There is always a demand for reduction in cost from the market.

Figure 2:
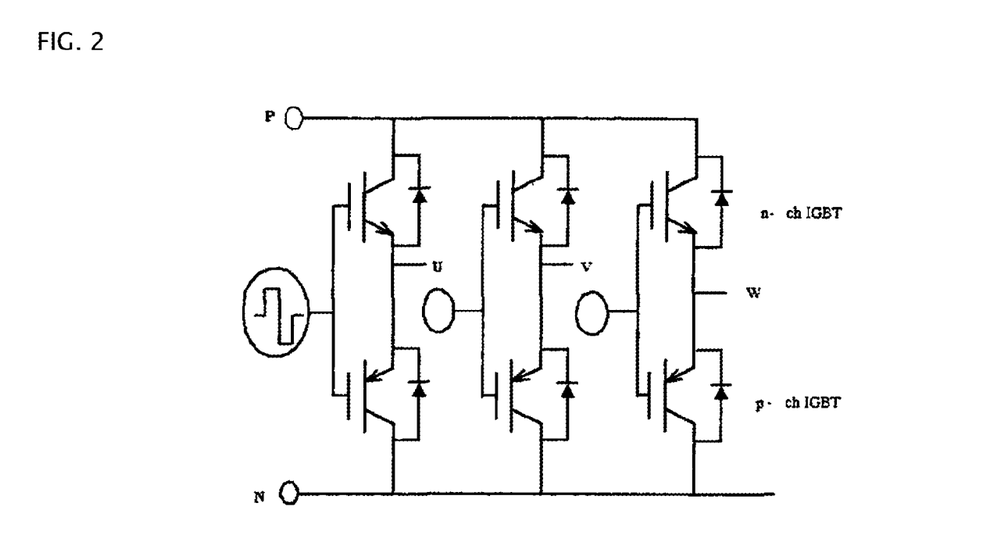
FIG. 2 is a diagram showing an example of an inverter circuit composed of complementary IGBT's and FWD's.

It is known well that the number of power sources necessary for the aforementioned gate driving circuits can be reduced to eliminate the increase in cost if the IGBT module is replaced by a complementary IGBT module composed of n-channel IGBT's and p-channel IGBT's of reverse polarity (JP-A-63-253720 and JP-A-2001-85612). For example, as shown in FIG. 2, the complementary IGBT module has a circuit configuration in which p-channel IGBT's are arranged in lower arms, n-channel IGBT's are arranged in upper arms, and respective FWD's are back-to-back arranged in the same manner as shown in FIG. 1. According to the circuit configuration, the number of gate driving circuits can be reduced from 4 to 3 so that reduction in device size and, accordingly, reduction in cost can be expected. Although an inverter is specified so that a dead time of several μsec long is set in on/off switching timing to avoid short-circuiting caused by simultaneous switching-on of the upper and lower arms, the dead time can be shortened according to the complementary module of the circuits shown in FIG. 2. As a result, there is a merit that distortion of output waveforms can be reduced.

The aforementioned complementary IGBT module is however currently unavailable on the market. This is because breakdown tolerance of p-channel IGBT's is too low to endure practical use compared with that of n-channel IGBT's. IEEE Transaction on Electron Devices (Vol. 38, pp. 303-309, 1991) has also described that p-channel IGBT's have low avalanche breakdown tolerance theoretically on operation. On the other hand, a silicon semiconductor (hereinafter abbreviated to as Si) is currently generally used as a substrate material of a power semiconductor element for controlling a high withstand voltage and a large current. On the market, there is a strong demand for a power device satisfying both a large current and a high speed. For this reason, stronger emphasis has been placed on improvement of IGBT's and power MOSFET's, so that the improvement has advanced up to an almost limit of the Si substrate material at present. Therefore, other semiconductor crystalline materials have been discussed from the viewpoint of improvement in large current and high speed of the power semiconductor element. As described in IEEE Transaction on Electron Devices (Vol. 36, p. 1811, 1989), silicon carbide semiconductor (hereinafter abbreviated to as SiC) is particularly excellent in low on-voltage and high speed/high temperature characteristic, so that attention is drawn to SiC as a next-generation power semiconductor material. Moreover, SiC is a chemically super-stable material which has a wide band gap of 3 eV and which is so excellent that SiC can be used extremely stably as a semiconductor even at a high temperature.

Figure 14:
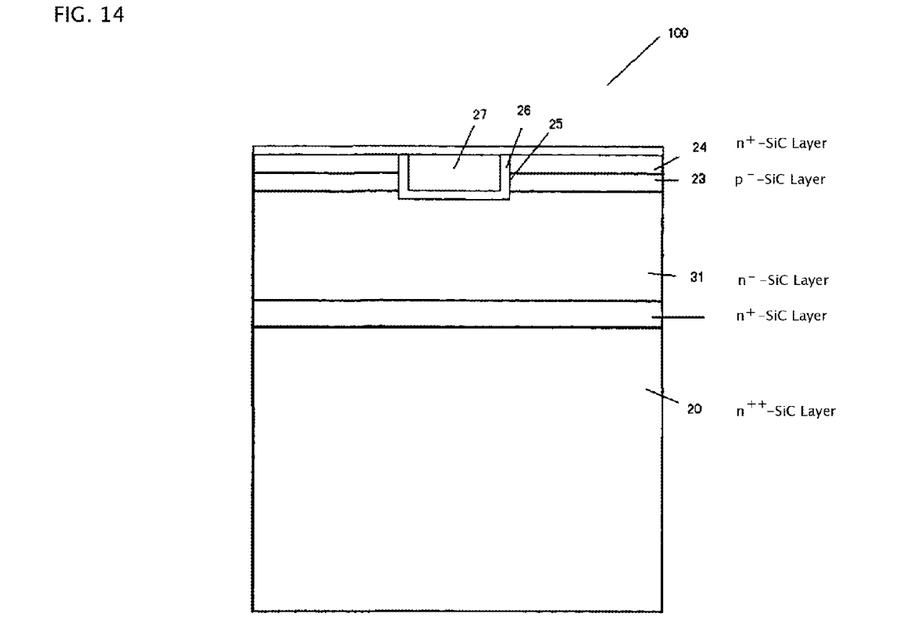
FIG. 14 is a sectional view of important part of an n-channel MOSFET produced by a producing process according to the background art.

In addition, attention is drawn to a power MOSFET as a power semiconductor element using the SiC as a semiconductor substrate. FIG. 14 is a sectional view showing important part of a general n-channel trench MOSFET made of SiC. The SiC n-channel trench MOSFET has an $n^+$ drain substrate (referred to as $n^{++}$-SiC substrate in FIG. 14) 20, an n-type drift layer (referred to as $n^-$-SiC layer 31 in FIG. 14) 31, a p base layer (referred to as p-SiC layer 23 in FIG. 14) 23, and an $n^+$ source region (referred to as $n^+$-SiC layer 24 in FIG. 14) 24 selectively formed on a surface layer of the p base layer 23. A trench 25 is provided so as to extend from a front surface of the $n^+$ source region 24, pass through the p base layer 23 and reach the n-type drift layer 31. The trench 25 is further filled with a gate electrode 27 made of conductive polysilicon or the like through a gate insulating film 26 formed on an inner surface of the trench 25. The symbols "+" and "−" attached to the right shoulders of the characters "n" and "p" show a relatively high impurity concentration and a relatively low impurity concentration respectively.

It is however known that a p-channel MOSFET obtained by inverting the polarity in the layer structure of the aforementioned SiC n-channel trench MOSFET exhibits such characteristic that an avalanche ionization rate for holes takes a larger value than an avalanche ionization rate for electrons under the condition that the same electric field is applied (Material Science Forum 2004, pp. 673-676, 2004). What is meant by this is that the p-channel MOSFET using holes as a carrier of a main current generates avalanche more frequently than the n-channel MOSFET using electrons as a current carrier. As a result, even in SiC MOSFET's, like the aforementioned SiC IGBT's, the p-channel MOSFET has lower avalanche breakdown tolerance than the n-channel MOSFET. Accordingly, SiC p-channel MOSFET's of practical use as well as IGBT's are unavailable on the market.

Moreover, in the n-channel trench MOSFET produced with use of a WBG substrate as shown in FIG. 14, because the maximum electric field intensity of the WBG is stronger than that of Si as described above, dielectric breakdown of the silicon oxide film is caused by an electric field applied to the bottom portion of each gate trench before the WBG reaches the avalanche breakdown electric field when a high voltage is applied between the source and drain of the MOSFET. To suppress the dielectric breakdown, a $p^+$-type region is provided in the bottom portion of each gate trench in the SiC n-channel trench MOSFET to thereby prevent application of an electric field not lower than the allowable electric field of the gate oxide film (IEEE Transaction on Electron Devices (Vol. 36, p. 1811, 1989)). The same thing can apply to the p-channel MOSFET. The provision of a dielectric breakdown protecting region in the bottom portion of each gate trench as described above is such hard work that cannot be said to be easy production because the p-channel MOSFET is likely to suffer not only increase of superfluous processes but also increase of on-resistance if the protecting region is not provided with good positional accuracy, like the n-channel MOSFET. If possible, it is desired to avoid the process of forming the protecting region.

Great expectations will be however placed on the future extension of SiC for use in power semiconductor devices, especially as an MOSFET semiconductor material because there is a high possibility that SiC will overcome the material limit in semiconductor characteristic of Si. If a p-channel MOSFET highly useful in practical use can be made of SiC, the merit thereof is large because a complementary MOSFET module highly useful in practical use can be formed when the p-channel MOSFET is combined with an n-channel MOSFET.

SUMMARY OF THE INVENTION

The invention provides a p-channel silicon carbide MOSFET which has high avalanche breakdown tolerance and sufficiently low on-resistance characteristic so as to be highly useful in practical use.

The invention, for example, preferably provides a p-channel silicon carbide MOSFET including a silicon carbide semiconductor substrate, a high-concentration p-type layer containing silicon carbide semiconductor as a main material and provided on one principal surface of the silicon carbide semiconductor substrate, a low-concentration p-type base layer containing silicon carbide semiconductor as a main material and provided on the high-concentration p-type layer, an n-type base layer containing silicon carbide semiconductor as a main material and provided on the low-concentration p-type base layer, p-type source regions (p-type source layer) selectively formed on a surface layer of the n-type base layer, first trenches extending from the p-type source regions, passing through the n-type base layer and reaching the p-type base layer, control electrodes packed through gate insulating films on surfaces of the p-type base layer exposed from inner surfaces of the first trenches, second trenches extending from the surface of the n-type base layer, passing through the n-type base layer and reaching the p-type base layer, source electrodes being in contact with inner surfaces of the second trenches while being in contact with the n-type base layer and the p-type source layer as contact regions located in the substrate surface around opening portions of the second trenches, and a drain electrode being in contact with the other principal surface of the silicon carbide semiconductor substrate, wherein: a plane pattern of the first trenches has a wide-interval first trench pattern portion where the second trench and the contact region are disposed between the first trenches, and a narrow-interval first trench pattern portion where the second trench and the contact region are not disposed between the first trenches; each second trench has a depth not smaller than each first trench; a distance between center lines of the first trench and the second trench is not larger than 10 µm; each of the source electrodes has a Schottky junction between the source electrode and a surface of the p-type base layer in a bottom portion of the second trench; third trenches are provided so as to extend from the other principal surface of the silicon carbide semiconductor substrate and reach the high-concentration p-type layer; and the drain electrode is in contact with p-type layer surface-containing inner surfaces of bottom portions of the third trenches.

The p-channel silicon carbide MOSFET can be produced by a production method in which, after the other principal surface of the silicon carbide semiconductor substrate is ground to provide the silicon carbide semiconductor substrate as a thin film before the drain electrode is formed, third trenches extending from the ground other principal surface and reaching the high-concentration p-type layer are formed and then the drain electrode is applied on the other principal surface of the silicon carbide semiconductor substrate so as to come into contact with the high-concentration p-type layer.

Moreover, when the silicon carbide semiconductor substrate is of a p type as its conductivity type and has a specific resistance (resistivity) not larger than 0.1 Ωcm, the p-channel silicon carbide MOSFET may be formed so that the drain electrode being in contact with the other principal surface of the p-type silicon carbide semiconductor substrate is provided without formation of the third trenches in the p-type silicon carbide semiconductor substrate.

According to the invention, it is possible to provide a p-channel silicon carbide MOSFET which has high avalanche breakdown tolerance and sufficiently low on-resistance characteristic so as to be highly useful in practical use.

BRIEF DESCRIPTION OF THE DRAWINGS

The invention will be described with reference to certain preferred embodiments thereof and the accompanying drawings, wherein.

DETAILED DESCRIPTION OF THE INVENTION

Embodiments of a p-channel silicon carbide MOSFET according to the invention and a method of producing the p-channel silicon carbide MOSFET will be described below in detail with reference to the drawings. The invention is not limited to the following description of the embodiments without departing from the gist thereof.

Embodiment 1

Figure 3:
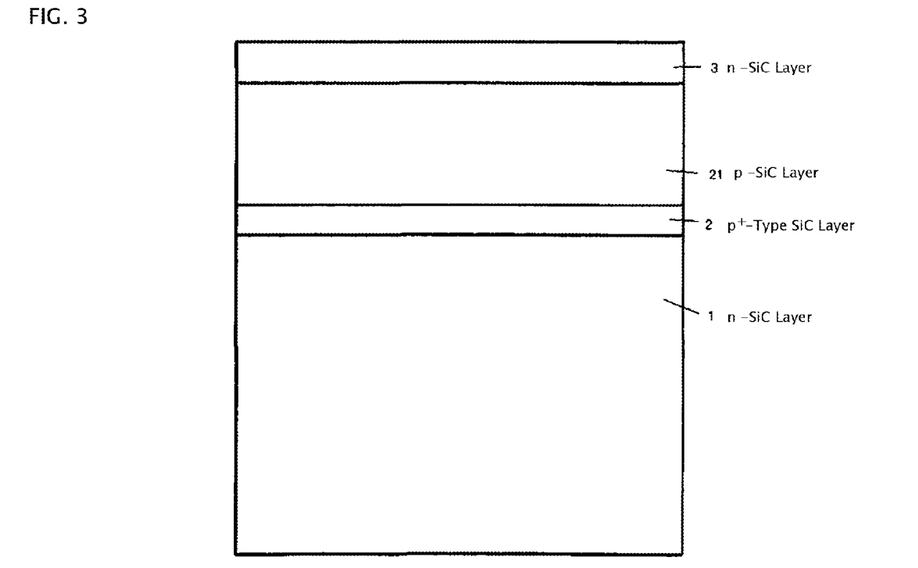
FIG. 3 is a sectional view (part 1) of important part of a process of producing a p-channel SiC-trench MOSFET according to Embodiment 1 of the invention.
Figure 4:
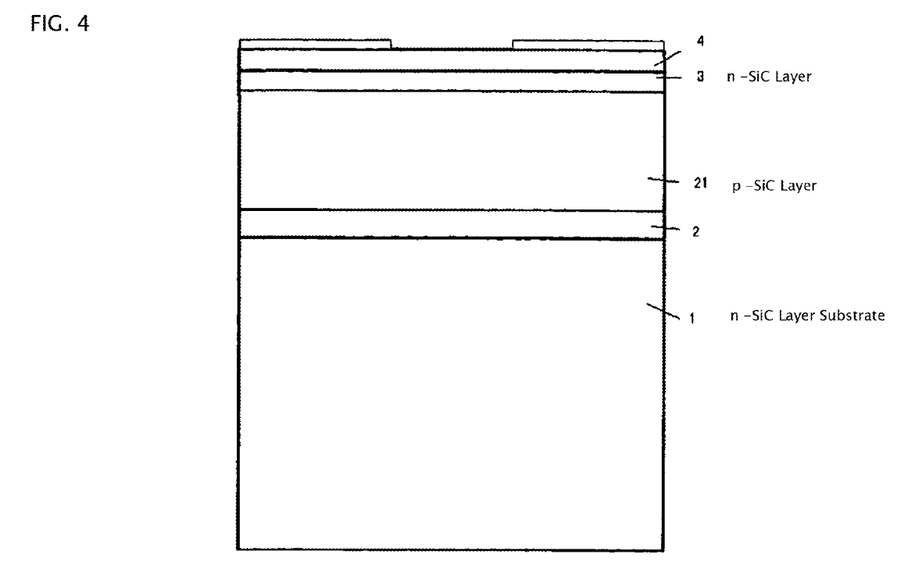
FIG. 4 is a sectional view (part 2) of important part of the process of producing a p-channel SiC-trench MOSFET according to Embodiment 1 of the invention.
Figure 5:
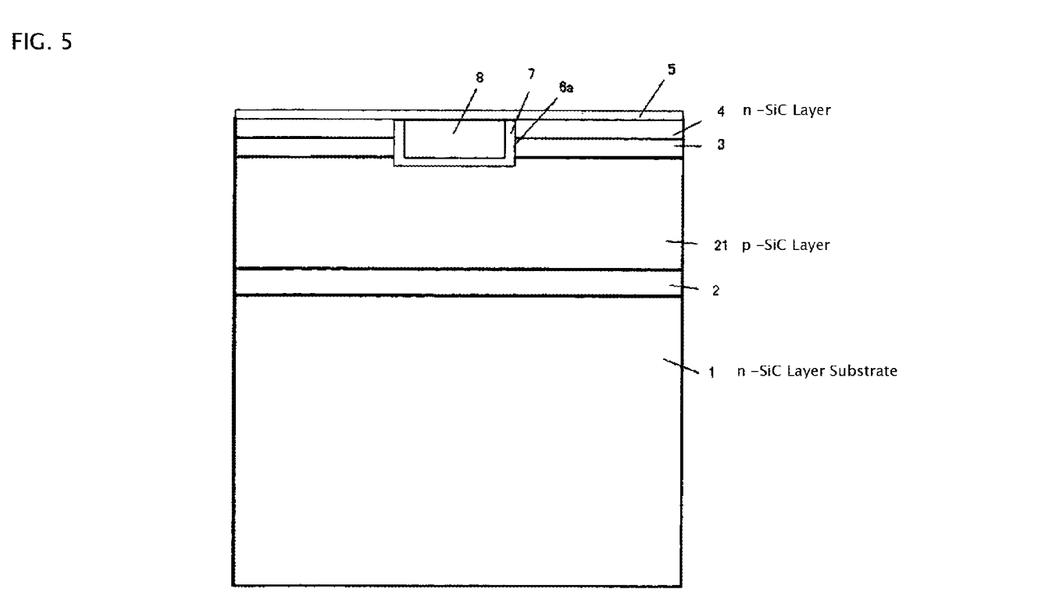
FIG. 5 is a sectional view (part 3) of important part of the process of producing a p-channel SiC-trench MOSFET according to Embodiment 1 of the invention.

Embodiment 1 of the invention will be described below with reference to FIGS. 3 to 7. Incidentally, in Embodiment 1, a trench MOSFET with a withstand voltage of 1200 V is provided as a vertical SiC p-channel MOSFET. First, an n-type SiC semiconductor substrate 1 (referred to as n-SiC substrate in FIG. 3) with a thickness of 400 μm is prepared. In Embodiment 1, the substrate 1 is provided as a high-resistance SiC semiconductor substrate containing about $2 \times 10^{14}$ $cm^{-3}$ of nitrogen as an impurity. However, in this embodiment, use of the high-resistance SiC semiconductor substrate is not essential, and a low-resistance SiC semiconductor substrate is also usable for a semiconductor substrate. A high impurity concentration $p^+$-type SiC layer 2 containing about $1.0 \times 10^{19}$ $cm^{-3}$ of an impurity and a p-type base layer 21 (referred to as p-SiC layer 21 in FIG. 3) containing about $1.0 \times 10^{16}$ $cm^{-3}$ of an impurity (the semiconductor layers described hereinafter are all SiC layers if there is no particular notice) are epitaxially grown successively on the SiC semiconductor substrate 1 so that the layers 2 and 21 become about 2 μm thick and about 10 μm thick respectively. An n-type base layer 3 (referred to as n-SiC layer in FIG. 3) containing about $2.1 \times 10^{17}$ $cm^{-3}$ of nitrogen as an impurity is further epitaxially grown on the p-type base layer 21 so that the layer 3 becomes about 2.5 μm thick (FIG. 3). Then, as shown in FIG. 4, a $p^+$ source layer 4 is formed in a region serving as an active portion by ion implantation and heat treatment. Aluminum is used as an impurity source of the $p^+$ source layer 4. The temperature and time for the heat treatment are 1700° C. and 1 minute. Then, a 1.6 μm-thick silicon oxide film (hereinafter abbreviated to as oxide film) is grown on a front surface of the $p^+$ source layer 4 and 1.0 μm-wide oxide film masks are formed at intervals of 2.0 μm by photolithography and etching. Then, as shown in FIG. 5, a first trench 6a for gate use which pierces the $p^+$ source layer 4 and the n-type base layer 3 (n-SiC layer) so as to reach the p-type base layer 21 is formed by etching from a front surface of each opening portion. Incidentally, the first trench 6a for gate use on this occasion is 3 μm deep. After an oxide film is then formed in the inside of the first trench 6a for gate use in which a gate electrode 8 will be formed by a post process, the oxide film is removed to smoothen the inner surface of the first trench 6a for gate use. After a 100 nm-thick gate oxide film 7 is then grown on the inside of the first trench 6a for gate use, a gate electrode 8 of conductive polysilicon or the like is embedded therein and an insulating layer 5 such as an oxide film is further formed on the gate electrode 8.

Figure 6:
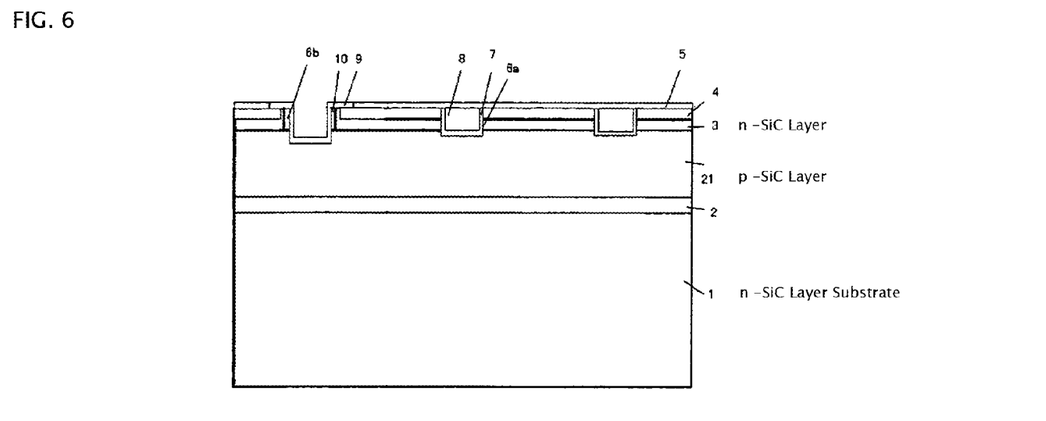
FIG. 6 is a sectional view (part 4) of important part of the process of producing a p-channel SiC-trench MOSFET according to Embodiment 1 of the invention.

It has been heretofore general that a source region is provided in a substrate surface layer between trenches for gate use and a region of contact with a source electrode is formed on a surface of the source region. In Embodiment 1, as shown in FIG. 6, an opening portion of an oxide film for forming a region of contact with a source electrode 9 is not provided in a substrate surface between the first trenches 6a for gate use but still covered with the oxide film. As a result, the interval between the first trenches 6a for gate use can be narrowed as sufficiently as possible.

Then, as shown in FIG. 6, a second trench 6b for contact with the source electrode 9 (hereinafter abbreviated to as second trench 6b for source use) is formed so as to correspond to the source electrode 9 portion. On this occasion, the width of the second trench 6b for source use is set at 1.0 μm and the depth of the second trench 6b for source use is set at 5 μm which is 2 μm deeper than 3 μm (the depth of the first trench 6a for gate use). The distance between the second trench 6b for source use and the first trench 6a for gate use is set at d=3.8 μm in terms of distance between center lines of the trenches. Then, nickel and titanium are sputtered on the inside of each second trench 6b for source use and the substrate surface and then aluminum is sputtered thereon to form a source electrode 9 composed of a laminated metal film of Ni/Ti/Al. On this occasion, an $n^+$ contact layer 10 with a high impurity concentration is provided between the source electrode 9 and the n-type base layer 3 (n-SiC layer) to reduce contact resistance. The source electrode 9 is in contact with the surface of the $p^+$ source layer 4 in addition to the n-type base layer 3 (FIG. 6).

Then, the 400 μm-thick n-type SiC semiconductor substrate 1 is back-ground from its rear surface to reduce the thickness to 100 μm in total. Although the SiC semiconductor substrate 1 generally as thick as about 400 μm is back-ground in Embodiment 1 to simplify a trench etching process as a post process, the back-grinding process may be dispensed with if the original SiC substrate is sufficiently thin. Then, a 5.0 μm-thick nickel film is formed on the rear surface of the n-type SiC semiconductor substrate 1 and 6 μm-wide nickel film masks are formed at intervals of 6 μm by photolithography and etching. Then, rear trenches (third trenches) 11 extending from the rear surface, passing through the n-type SiC semiconductor substrate 1 and reaching the high-concentration $p^+$-type SiC layer 2 are formed by etching. A drain electrode 13 composed of a laminated metal film of Ti/Ni/Au is formed by lamination so that bottom and side surfaces of the formed rear trenches (third trenches) 11 and the whole rear surface of the n-type SiC semiconductor substrate 1 are covered with the drain electrode 13. Thus, an SiC p-channel trench MOSFET is completed (FIG. 7).

Figure 7:
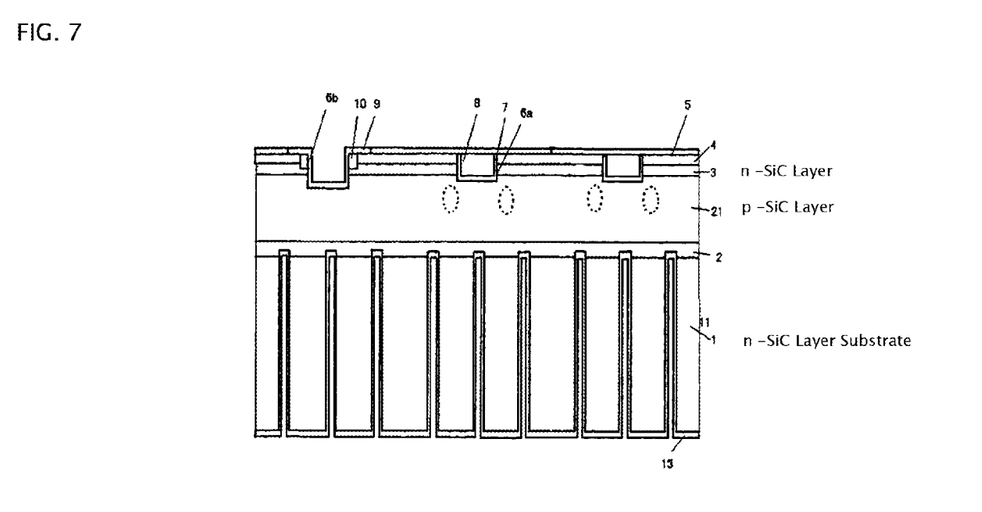
FIG. 7 is a sectional view of important part of an active portion of the p-channel SiC-trench MOSFET according to Embodiment 1 of the invention.
Figure 8:
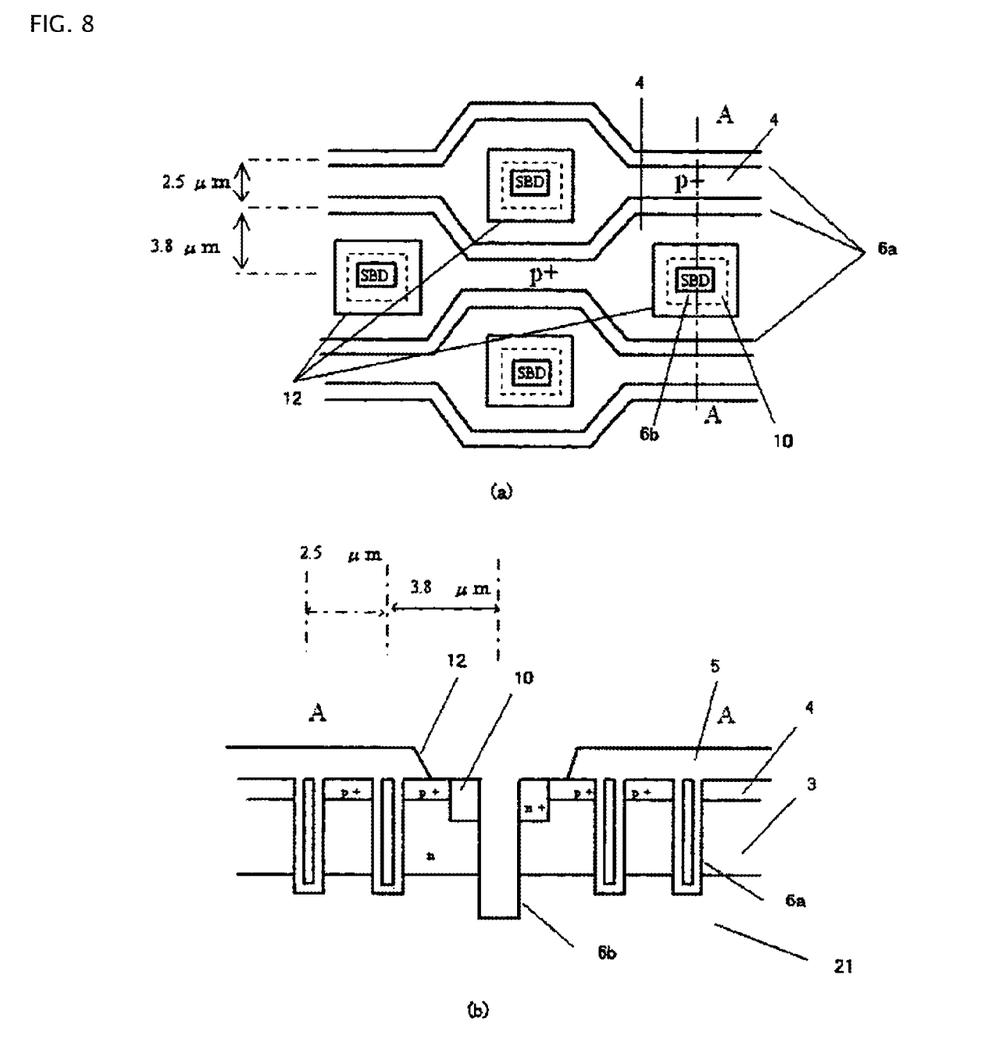
FIG. 8A is a plan view of important part of an active portion of the p-channel SiC-trench MOSFET according to Embodiment 1 of the invention.
FIG. 8B is a sectional view taken along the line A-A' in FIG. 8A.

FIG. 8A is a top view of important part showing apart of a p-channel trench MOSFET chip according to Embodiment 1 shown in FIG. 7. Incidentally, the metal film of each source electrode 9 is not shown in FIG. 8A to make it easy to view a pattern of the contact region 12 of each source electrode 9 including the second trench 6b and a SBD (Schottky barrier diode). Each outer frame region surrounding the character string "SBD" is the contact region 12 of the source electrode 9 including a Schottky junction portion 6b. In each contact region 12, a source electrode not shown is brought into contact with both surfaces of the $n^+$ contact layer 10 and the $p^+$ source layer 4 (the $n^+$ contact layer 10 is designated by a broken line in the contact region 12 in FIG. 8A). As shown in FIGS. 8A and 8B, the contact region 12 of each source electrode 9 is formed on a cell around the second trench 6b, so that the distance between the first trenches 6a for gate use without interposition of the cell around the second trench 6b can be reduced to 2.5 μm. FIG. 8B is a sectional view taken along the line A-A' in FIG. 8A. FIG. 8B shows that the distance between the center line of the first trench 6a for gate use and the center line of the second trench 6b is 3.8 μm but the distance between the first trenches 6a for gate use without interposition of the cell around the second trench 6b can be reduced to 2.5 µm.

Figure 9:
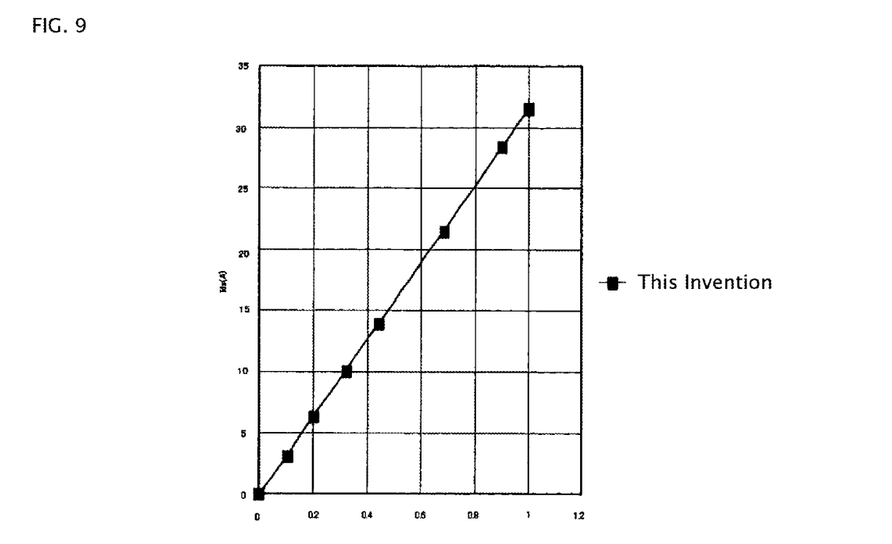
FIG. 9 is a graph showing I-V characteristic of the p-channel SiC-trench MOSFET according to Embodiment 1 of the invention.
Figure 10:
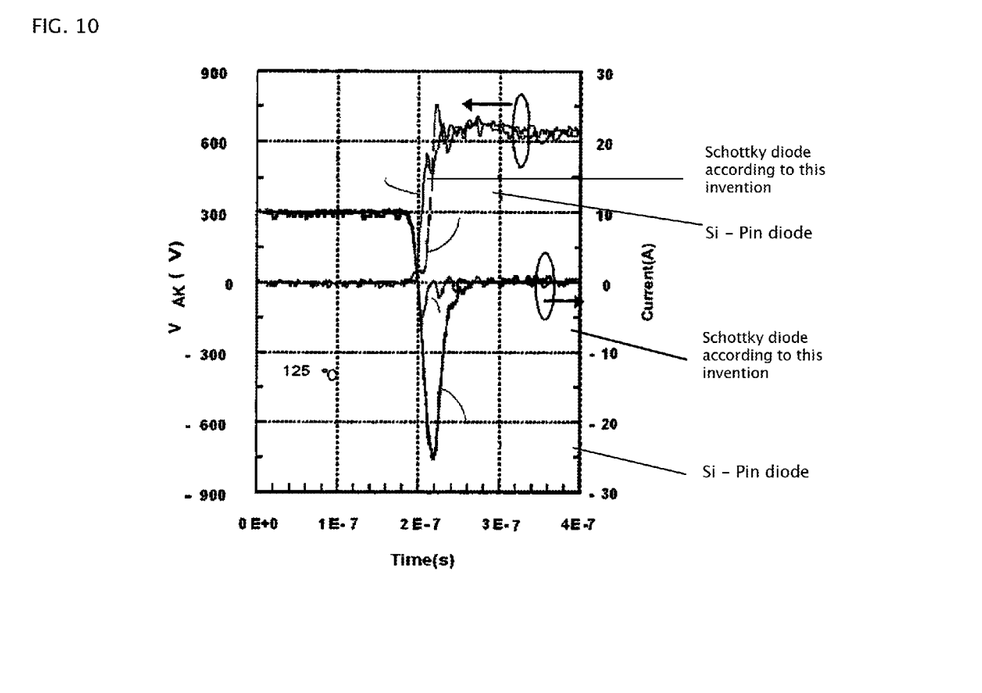
FIG. 10 is a graph showing reverse recovery characteristic of a built-in Schottky diode of the p-channel SiC-trench MOSFET according to Embodiment 1 of the invention in comparison with that of a silicon-PiN diode with the same withstand voltage and the same current rating (1200 V/10 A element)

FIG. 9 shows a measured result of electric characteristic of the SiC p-channel MOSFET. The chip size was 3 mm square, the area of the active portion was 7.85 mm$^2$, and the rating current was 10 A. Although the element withstand voltage and drain current values of the p-channel MOSFET exhibit negative values, these values will be expressed comprehensibly in absolute values in this specification. It was apparent from FIG. 9 that on-resistance (RonA) took a sufficiently low value of 2.48 mΩcm$^2$. The initial element withstand voltage was 1250 V which showed sufficiently good characteristic of a 1200 V device. For comparison, a trench MOSFET having a structure in which the second trenches 6b were not formed in the source electrode portions was formed and the withstand voltage thereof was measured. As a result, the element withstand voltage was 610 V. The breakdown point thereof was further observed, so that it was confirmed that the breakdown point was the bottom portion of the first trench 6a for gate use. From this fact, it was apparent that electric field concentration into the bottom portion of the first trench 6a for gate use could be relaxed to keep the withstand voltage characteristic stable when the second trench 6b deeper than the first trench 6a for gate use was formed in the source electrode portion. When I-V characteristic (not shown) of a built-in Schottky diode was measured, good characteristic was obtained. For example, the on-voltage of the Schottky diode at a current of 10 A was 1.58 V (room temperature) which was lower than the on-voltage 1.62 V (room temperature) of a silicon PiN diode. When the reverse recovery characteristic of the built-in Schottky diode was further measured, it was apparent that the reverse recovery time was very short compared with that of a silicon PiN diode at the same rating voltage and current, as shown in FIG. 10. As a result, it is possible to obtain such low loss characteristic that the loss caused by the Schottky diode is reduced to about one tenth as much as the loss caused by the silicon PiN diode. The notation 1E-7, etc. written in the time axis Time (s) shown on the horizontal axis of FIG. 10 means $1\times10^{-7}$ (seconds), etc.

Then, electric characteristic was evaluated in the condition that the depth of the first trench 6a in the gate electrode portion was set at 3 µm while the depth of the second trench 6b in the source electrode portion was changed at least under the condition that the depth of the second trench 6b was larger than the thickness of the n-type base layer 3 (n-SiC layer). Specifically, the depth of the second trench 6b was changed to 2.7 µm, 2.85 µm, 3 µm, 4 µm, 5 µm and 5.5 µm, so that six kinds of elements were formed and characteristics thereof were examined. Incidentally, the distance d between the first trench 6a in the gate electrode portion and the second trench 6b in the source electrode portion was set at 3.8 µm as a constant value. As a result, it is apparent from the following Table 1 that an element withstand voltage not lower than 1200 V is exhibited when the depth of the second trench is not smaller than 3 µm, inclusive of the case where the second trench 6b is not formed in the source electrode portion. That is, it is apparent that the second trench 6b in the source electrode portion needs a depth not smaller than the depth 3 µm of the first trench 6a in the gate electrode portion.

TABLE 1

| Trench Depth (µm) | Withstand Voltage (V) |
| --- | --- |
| 0 | 610 |
| 2.70 | 1088 |
| 2.85 | 1105 |

TABLE 1-continued

| Trench Depth (µm) | Withstand Voltage (V) |
| --- | --- |
| 3.00 | 1210 |
| 4.00 | 1233 |
| 5.00 | 1250 |
| 5.50 | 1259 |

Next, the trench distance d between the second trench 6b in the source electrode portion and the first trench 6a in the gate electrode portion was changed to produce trench MOSFET's by way of trial. Change of electric characteristic in this case was evaluated and shown in the following Table 2. Incidentally, in this case, the depth of the second trench 6b in the source electrode portion was set at 5 µm while the depth of the first trench 6a in the gate electrode portion was set at 3 µm. As a result, it is apparent from Table 2 that the initial withstand voltage of the element decreases as the trench distance d increases.

TABLE 2

| Trench Distance d (µm) | Initial Withstand Voltage (V) | Withstand Voltage (V) After High-Temperature Application Test |
| --- | --- | --- |
| 2.0 | 1258 | 1256 |
| 3.0 | 1255 | 1254 |
| 5.0 | 1250 | 1251 |
| 7.0 | 1240 | 1232 |
| 9.0 | 1231 | 1225 |
| 10.0 | 1218 | 1214 |
| 12.0 | 1207 | 35 |
| 15.0 | 1201 | 25 |
| 19.0 | 1185 | 20 |
| 21.0 | 1180 | 20 |

Reduction in the initial withstand voltage shown in Table 2 is caused by the following fact. As the trench distance d is widened, a pinch-off effect of a so-called depletion layer is weakened when a high voltage is applied between the source and the drain. As a result, the electric field concentrated into the bottom portion of the first trench 6a for gate use increases. Similarly to the result in Table 1, as a result of increase of electric field intensity in the bottom portion of the gate electrode, the gate oxide film is dielectrically broken down.

A high-temperature application test was further performed on MOSFET's in the condition of a withstand voltage not lower than 1200 V. This evaluation was one of long-term reliability evaluations that a voltage of 1200 V was continuously applied between the source and the drain for 3000 hours under the condition of 125° C. and then the element withstand voltage was evaluated. As a result, in the condition that the trench distance d was 12 µm or 15 the initial withstand voltage was not lower than 1200 V but the withstand voltage after the high-temperature application test was far lower than 1200 V. Further, as a result of examination of the breakdown point, it was confirmed that the oxide film in the bottom portion of the first trench 6a for gate use was broken. On the other hand, when the distance d was 10 µm, the withstand voltage after the high-temperature application test was not lower than 1200 V. From this fact, it is apparent that withstand voltage characteristic can be kept sufficiently high even in consideration of not only the initial withstand voltage but also long-term reliability when the trench distance d is not longer than 10 µm.

Figure 11:
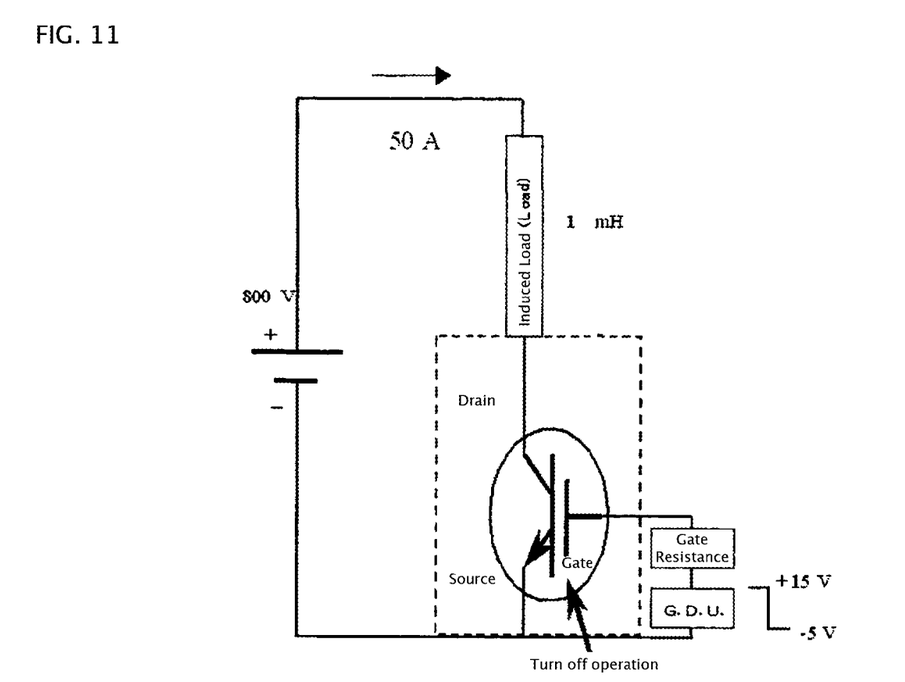
FIG. 11 is a diagram of a circuit for measuring L-loaded turn-off tolerance.
Figure 12:
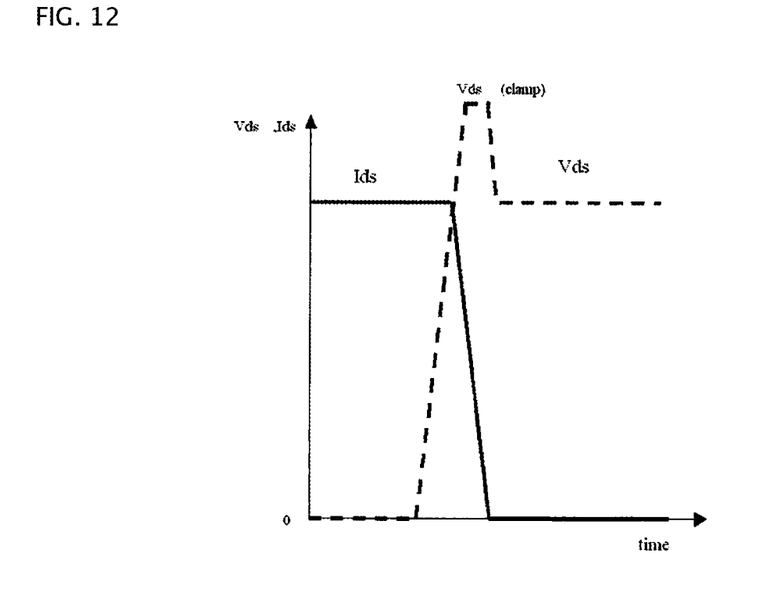
FIG. 12 is a schematic graph of a turn-off waveform of the p-channel SiC-trench MOSFET according to Embodiment 1 of the invention.

Next, an L-loaded turn-off tolerance test was performed. The tolerance measuring circuit was a usual measuring circuit shown in FIG. 11. The supply voltage was Vcc=800 V. The measurement temperature was 25° C. FIG. 12 is a schematic graph showing a turn-off waveform. As a result, it was confirmed that the source-drain voltage at turn-off could be clamped to 1230 V (Vds (clamp) in FIG. 12) so as to be turned off without breakdown even when the turn-off current was 50 A which was five times as much as the rating current of the element. From this fact, it can be said that the SiC p-channel MOSFET according to the invention is an element having very high avalanche tolerance.

Incidentally, an SiC p-channel MOSFET was produced to have the same configuration as shown in FIG. 7, except that the n-type SiC semiconductor substrate 1 described in Embodiment 1 was replaced by a substrate containing a higher concentration of about $2 \times 10^{18}$ cm$^{-3}$. Various kinds of characteristic evaluations were performed on the SiC p-channel MOSFET in the same manner as described above. As a result, it was apparent that the SiC p-channel MOSFET exhibited substantially the same electric characteristic as the aforementioned characteristic.

As disclosed in JP-A-8-204179 and U.S. Pat. Nos. 5,693,569 and 5,614,749, there is a description that a built-in diode of an SiC trench MOSFET is provided as a Schottky junction type diode in order to reduce on-resistance in the SiC trench MOSFET. According to the description, if such a Schottky diode can be built in, the Schottky diode can be used as an FWD when each IGBT is replaced by an MOSFET in an inverter circuit shown in FIG. 1 or 2. Accordingly, there is obtained a merit that reduction in size of the aforementioned circuit device can be achieved. There is further a description that avalanche breakdown is generated in a bottom portion of a trench in each source electrode portion having a built-in Schottky diode to thereby suppress dielectric breakdown of a gate oxide film in a bottom portion of a trench in each gate electrode portion.

According to the MOSFET configured thus, although dielectric breakdown hardly occurs in the gate oxide film in the bottom portion of the trench in the gate electrode portion, high electric field intensity is applied on the bottom portion of the trench in the gate electrode portion if both trench intervals in the Schottky diode and the gate electrode portion are not optimized. As a result, for example, even when dielectric breakdown does not occur initially in the oxide film in the bottom portion of the trench in the gate electrode portion, there is a risk that the oxide film in the bottom portion of the trench in the gate electrode portion will be apt to be dielectrically broken down after a long-term element operation.

Therefore, in Embodiment 1 of the invention, the distance between the first trench 6a in each gate electrode portion (first trench 6a for gate use) and the second trench 6b in each Schottky electrode portion (second trench 6b for source use) is set to be sufficiently short in a range to exert no bad influence on other characteristics in order to prevent the aforementioned dielectric breakdown. This is because electric field concentration into the bottom portion of the first trench 6a is relaxed rapidly by a pinch-off effect of a so-called depletion layer at the time of application of a high voltage between the source and the drain when the trench distance is sufficiently short. As a result, the load imposed on the gate oxide film can be reduced even after the long-term element operation to obtain a merit that improvement of long-term reliability is attained.

Moreover, the distance (interval) between the first trenches 6a in a portion disposed in the contact region in which the source electrode in the substrate surface can be brought into contact with the Schottky electrode portion and the p$^+$ source layer 4 is widened but the contact region of the source electrode is not provided in other portions of the substrate surface so that the distance between the first trenches 6a can be shortened as sufficiently as possible. According to this configuration, the electric field in portions (designated by the broken-line circles in FIG. 7) which are in the p-type base layer 21 near the first trenches 6a and in which avalanche is most frequently caused by the pinch-off effect can be reduced in the portion where the distance between the first trenches 6a is shortened, so that avalanche breakdown tolerance can be increased as much as possible.

It is also said that SiC is hard to produce a p-type substrate with low resistance and low defect density. For example, in most cases, a p-type SiC substrate has resistivity higher than 10 times as much as that of an n-type SiC substrate and has defect density one-digital higher than that of the n-type SiC substrate. For this reason, there is a problem that on-resistance cannot be reduced sufficiently because the electric potential drop in the p-SiC substrate is large even when the p-type SiC substrate is used for producing a p-channel MOSFET.

On the contrary, in the SiC p-channel MOSFET according to Embodiment 1 of the invention, third trenches which are so deep that the third trenches extend from the other surface of the SiC semiconductor substrate 1 and reach the p-type semiconductor layer 2 are formed, and a drain electrode is provided so that bottom and side surfaces of the third trenches and the rear surface of the semiconductor substrate 1 are covered with the drain electrode. Incidentally, it is preferable that the SiC semiconductor substrate 1 is ground from the rear surface to reduce the whole thickness of the SiC semiconductor substrate 1 before the formation of the third trenches in order to simplify the process of forming the third trenches.

Embodiment 2

Embodiment 2 will be described on a trench MOSFET with a withstand voltage of 1200 V in the case where a p-type SiC substrate is used as an SiC substrate. Embodiment 2 is different from Embodiment 1 in the polarity and specific resistance (resistivity) of the SiC substrate. First, an aluminum-doped p-type SiC substrate was prepared. In this embodiment, a p-type SiC substrate containing an impurity concentration of about $2 \times 10^{18}$ cm$^{-3}$ was used. The specific resistance of the p-type SiC substrate was 7 Ωcm which was far lower than that of the n-type SiC substrate described in Embodiment 1. The element forming process after that was performed in the same manner as in Embodiment 1. The chip size was 3 mm square, the area of the active portion was 7.85 mm$^2$, and the rating current was 10 A. On-resistance (RonA) exhibited a sufficiently low value of 2.56 mΩcm$^2$. The initial element withstand voltage was 1258 V which exhibited sufficiently good characteristic of a 1200 V element. When I-V characteristic of the built-in Schottky diode was measured, good characteristic was obtained. For example, on-resistance at a current of 10 A was 1.58 V (room temperature) which was a lower value than the on-resistance 1.62 V (room temperature) of a silicon PiN diode. When reverse recovery characteristic of the built-in Schottky diode was measured, it was found that the reverse recovery time was very short compared with a silicon PiN diode with the same rating voltage and current. As a result, it was possible to obtain such low loss characteristic that the loss caused by the diode was about one tenth as much as the loss caused by a silicon PiN diode. This characteristic is the same as the characteristic in Embodiment 1.

A high-temperature application test was further performed in the same manner as in Embodiment 1. As a result, it was found that withstand voltage characteristic can be kept sufficiently high even in consideration of not only the initial withstand voltage but also long-term reliability because there was no withstand voltage change even when a voltage of 1200 V was continuously applied between the source and the drain for 3000 hours under the condition of 125° C.

Embodiment 3

In a p-type SiC substrate with low resistance and low crystal defect density, it is however unnecessary to form deep third trenches in the other surface of the substrate in the aforementioned manner. In this case, an MOSFET having a layer structure composed of a p-type SiC semiconductor substrate 1, a p-type base layer 21 with a low impurity concentration formed on the p-type SiC semiconductor substrate 1, and an n-type base layer 3 formed on the p-type base layer 21 may be produced in the same manner as a usual MOSFET.

Figure 13:
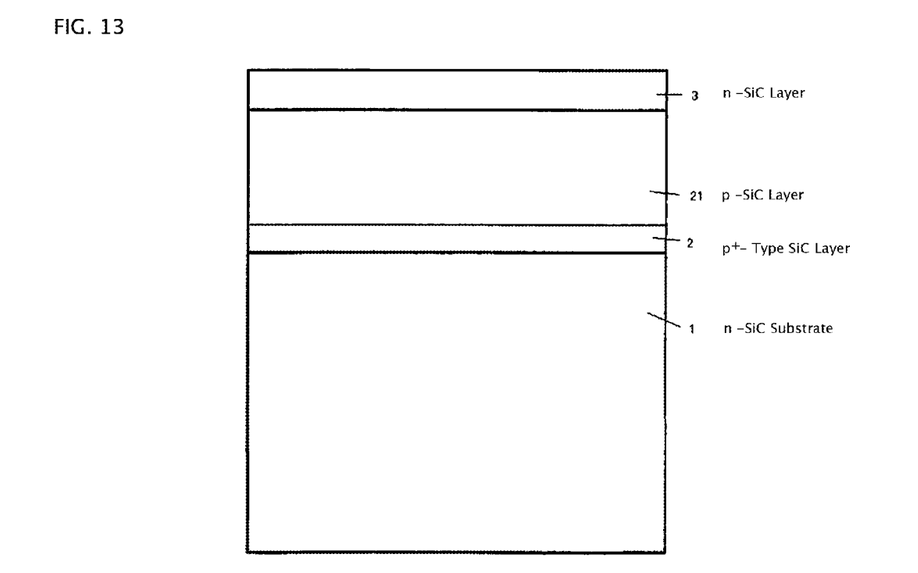
FIG. 13 is a sectional view of important part of an active portion of a p-channel SiC-trench MOSFET according to Embodiment 3 of the invention.

Embodiment 3 will be described on a trench MOSFET (FIG. 13) with a withstand voltage of 1200 V in the case where a low-resistance p-type SiC substrate is used as the SiC semiconductor substrate 1. Embodiment 3 is different from Embodiment 2 in that the specific resistance of the p-type SiC in Embodiment 3 is far lower. As a result, Embodiment 3 does not require the third trenches formed in the rear surface of the p-type SiC substrate in Embodiments 1 and 2. First, an aluminum-doped p-type SiC semiconductor substrate 51 was prepared. In this embodiment, a substrate containing a high impurity concentration of about $2 \times 10^{20}$ cm$^{-3}$ was used. The specific resistance of the p-type SiC semiconductor substrate 51 was 0.07 Ωcm which was far lower than those of the substrates described in Embodiments 1 and 2. The element forming process after that was performed up to FIG. 6 in the same manner as in Embodiment 1. After that, because the specific resistance of the p-type SiC semiconductor substrate 51 was sufficiently low, a Ti/Ni/Au metal film was formed by lamination so that the whole rear surface of the p-type SiC semiconductor substrate 51 without formation of any third trench in the rear surface was covered with the metal film. Thus, a p-channel MOSFET according to Embodiment 3 was completed (FIG. 13). The chip size was 3 mm square, the area of the active portion was 7.85 mm$^2$, and the rating current was 10 A. On-resistance (RonA) exhibited a sufficiently low value of 2.98 Ωcm$^2$. The initial element withstand voltage was 1249 V which exhibited sufficiently good characteristic of a 1200 V element. When I-V characteristic of the built-in Schottky diode was measured, good characteristic was obtained. For example, on-resistance at a current of 10 A was 1.68 V (room temperature) which was a value substantially equal to the on-resistance 1.62 V (room temperature) of a silicon PiN diode. When reverse recovery characteristic of the built-in Schottky diode was further measured, the reverse recovery time was very short compared with a silicon PiN diode with the same rating voltage and current. As a result, it was possible to obtain such low loss characteristic that the loss caused by the diode was about one tenth as much as the loss caused by a silicon PiN diode. This characteristic is the same as the characteristic in Embodiment 1. A high-temperature application test was further performed in the same manner as in Embodiment 1. As a result, it was found that withstand voltage characteristic can be kept sufficiently high even in consideration of not only the initial withstand voltage but also long-term reliability because there was no withstand voltage change even when a voltage of 1200 V was continuously applied between the source and the drain for 3000 hours under the condition of 125° C. Then, as a result of measurement of on-resistance values in the case where the specific resistance value of the p-type SiC substrate was changed variously, it is apparent from the following Table 3 that low on-resistance characteristic can be achieved without formation of any third trench in the rear surface of the p-type SiC semiconductor substrate 51 as long as the specific resistance of the p-type SiC substrate is not higher than 0.1 Ωcm.

TABLE 3

| Substrate Resistivity (Ωcm) | On-Resistance (mΩcm$^2$) |
|---|---|
| 10 | 101.98 |
| 2 | 21.98 |
| 0.6 | 8.98 |
| 0.1 | 2.98 |
| 0.03 | 2.28 |
| 0.008 | 2.06 |

According to Embodiments 1 to 3 described above, there is a feature that trenches are formed so as to come close to each other not only as the first trenches in the gate electrode portions but also as the second trenches in the source electrode portions, and that the second trenches 6b for source use are formed so as to be deeper than the first trenches 6a for gate use. Moreover, a source electrode is formed on the inner surface of each second trench 6b for source use to form a Schottky junction with the p base layer to thereby make it possible to form a built-in Schottky diode having a low on-resistance and a short reverse recovery time in a p-channel MOSFET of wide band gap semiconductor. By this element configuration, a small-size low-loss semiconductor device can be produced. Moreover, because electric field concentration into the bottom portion of each first trench 6a for gate use can be relaxed remarkably, the load imposed on the gate oxide film can be reduced to provide a p-channel MOSFET excellent in long-term reliability. Moreover, a contact region is formed not only in the second trench but also on the cell in the substrate surface so that the source electrode portion including the Schottky junction is brought into contact with the n base layer surface and the p source region surface. Moreover, the distance between the first trenches 6a for gate use which are provided out of the source electrode portion is shortened to make it possible to relax electric field intensity in portions (designated by the broken-line circles in FIG. 7) which are in the p base layer near the first trenches 6a for gate use and in which avalanche is most frequently caused by the pinch-off effect. As a result, avalanche breakdown tolerance can be improved greatly even in a p-channel MOSFET using holes having a high avalanche ionization rate as a main current carrier.

In addition, third trenches passing through the SiC substrate from the rear surface can be formed according the value of specific resistance of the SiC substrate so that the drain electrode on the rear surface comes into direct contact with the high-concentration p$^+$-SiC layer. In this case, an SiC p-channel MOSFET with high avalanche breakdown tolerance and low on-resistance is completed regardless of the resistivity and defect density of the semiconductor substrate. In this manner, a p-channel MOSFET complimentary to an n-channel MOSFET can be formed so that simplification of driving power supply circuits, or the like, can be achieved.

As described above, in the silicon carbide p-channel MOSFET according to the invention, a Schottky diode can be built in regardless of the polarity and specific resistance of the SiC semiconductor substrate and an element having high avalanche breakdown tolerance and exhibiting good electric characteristic and long-term reliability can be provided without provision of any gate oxide film protecting p$^+$-type region in the bottom portion of each first trench for gate use. As a result, a smaller-size lower-loss semiconductor device can be produced. In addition, an MOSFET module composed of n-channel MOSFET's and p-channel MOSFET's complementarily can be configured.

The invention has been described with reference to certain preferred embodiments thereof. It will be understood, however, that modifications and variations are possible within the scope of the appended claims.

What is claimed is:

1. A p-channel silicon carbide MOSFET comprising:
   a silicon carbide semiconductor substrate;
   a high-concentration p-type layer containing silicon carbide semiconductor provided on one principal surface of the silicon carbide semiconductor substrate;
   a low-concentration p-type base layer containing silicon carbide semiconductor provided on the high-concentration p-type layer;
   an n-type base layer containing silicon carbide semiconductor provided on the low-concentration p-type base layer;
   p-type source regions selectively formed on a surface layer of the n-type base layer;
   first trenches extending from the p-type source regions, passing through the n-type base layer and reaching the p-type base layer;
   control electrodes packed through gate insulating films on surfaces of the p-type base layer exposed from inner surfaces of the first trenches;
   second trenches extending from the surface of the n-type base layer, passing through the n-type base layer and reaching the p-type base layer;
   source electrodes in contact with inner surfaces of the second trenches while being in contact with the n-type base layer and the p-type source layer as contact regions located in the substrate surface around opening portions of the second trenches; and
   a drain electrode in contact with the other principal surface of the silicon carbide semiconductor substrate,
   wherein a plane pattern of the first trenches has a wide-interval first trench pattern portion where the second trench and the contact region are disposed between the first trenches, and a narrow-interval first trench pattern portion where the second trench and the contact region are not disposed between the first trenches;
   wherein each second trench has a depth not smaller than each first trench;
   wherein a distance between center lines of the first trench and the second trench is not larger than 10 µm;
   wherein each of the source electrodes has a Schottky junction between the source electrode and a surface of the p-type base layer in a bottom portion of the second trench;
   wherein third trenches are provided so as to extend from the other principal surface of the silicon carbide semiconductor substrate and reach the high-concentration p-type layer; and
   wherein the drain electrode is in contact with p-type layer surface-containing inner surfaces of bottom portions of the third trenches.

2. A p-channel silicon carbide MOSFET comprising:
   a silicon carbide semiconductor substrate;
   a high-concentration p-type layer containing silicon carbide semiconductor provided on one principal surface of the silicon carbide semiconductor substrate;
   a low-concentration p-type base layer containing silicon carbide semiconductor provided on the high-concentration p-type layer;
   an n-type base layer containing silicon carbide semiconductor provided on the low-concentration p-type base layer;
   p-type source regions selectively formed on a surface layer of the n-type base layer;
   first trenches extending from the p-type source regions, passing through the n-type base layer and reaching the p-type base layer;
   control electrodes packed through gate insulating films on surfaces of the p-type base layer exposed from inner surfaces of the first trenches;
   second trenches extending from the surface of the n-type base layer, passing through the n-type base layer and reaching the p-type base layer;
   source electrodes being in contact with inner surfaces of the second trenches while being in contact with the n-type base layer and the p-type source layer as contact regions located in the substrate surface around opening portions of the second trenches; and
   a drain electrode being in contact with the other principal surface of the silicon carbide semiconductor substrate;
   wherein a plane pattern of the first trenches has a wide-interval first trench pattern portion where the second trench and the contact region are disposed between the first trenches, and a narrow-interval first trench pattern portion where the second trench and the contact region are not disposed between the first trenches;
   wherein each second trench has a depth not smaller than each first trench;
   wherein a distance between center lines of the first trench and the second trench is not larger than 10 µm;
   wherein each of the source electrodes has a Schottky junction between the source electrode and a surface of the p-type base layer in a bottom portion of the second trench; and
   wherein the silicon carbide semiconductor substrate is of a p type as its conductivity type and has a specific resistance not larger than 0.1 Ωcm.

* * * * *